United States Patent
Singer et al.

[11] Patent Number: 6,043,641
[45] Date of Patent: Mar. 28, 2000

[54] METHOD AND APPARATUS FOR RAPID DETERMINATIONS OF VOLTAGE AND CURRENT IN WIRES AND CONDUCTORS

[76] Inventors: Jerome R. Singer, 2917 Avalon Ave., Berkeley, Calif. 94705; Joel M. Libove, 34 Canyon View Dr., Orinda, Calif. 94563

[21] Appl. No.: 09/081,263

[22] Filed: May 19, 1998

Related U.S. Application Data

[63] Continuation-in-part of application No. 09/025,043, Feb. 17, 1998.

[51] Int. Cl.$^7$ ............................................... G01R 19/145
[52] U.S. Cl. ........................... 324/127; 324/115; 324/72.5
[58] Field of Search .................... 324/115, 117 R, 324/122, 126, 127, 123 R, 142, 72.5

[56] References Cited

U.S. PATENT DOCUMENTS

| | | | |
|---|---|---|---|
| 3,611,339 | 10/1971 | Richey et al. | 324/122 |
| 3,986,116 | 10/1976 | Smith et al. | 324/127 |
| 4,314,201 | 2/1982 | Marro et al. | 324/127 |
| 4,321,529 | 3/1982 | Simmonds et al. | 324/127 |
| 4,454,557 | 6/1984 | Hurley | 324/127 |
| 4,471,300 | 9/1984 | Harnden et al. | 324/127 |
| 4,558,310 | 12/1985 | McAllise | 324/127 |

*Primary Examiner*—Diep N. Do
*Attorney, Agent, or Firm*—Howard Cohen

[57] ABSTRACT

A device for non-contact, non-invasive measurement of current or power in a wire, cable or conductor includes a small coil having multiple turns with a thin ferromagnetic strip. The coil may be secured to a wand or housing adapted to be used to place the coil in close proximity to the wire, cable or conductor, whereby a voltage is induced in the coil. An amplifier and or an analog or digital signal processor is utilized to increase sensitivity. A readout indicates the magnitude of the induced voltage, and a scaling device renders the readout display indicative of the current or power in the wire, cable, or conductor. The readout may comprise a digital display, a series of light emitting devices, an oscilloscope, a digital computer display system, or a flashing light emitting device having a flash rate proportional to the magnitude of the voltage. The device may be constructed in a wand or pen-like fashion, with the coil and strip incorporated into the wand. The device may be combined with a voltage sensor to read out relative voltages.

22 Claims, 3 Drawing Sheets

METHOD AND APPARATUS FOR RAPID DETERMINATIONS OF VOLTAGE AND CURRENT IN WIRES AND CONDUCTORS

This application is a continuation-in-part of our earlier co-pending commonly assigned application Ser. No. 09/025,043 filed Feb. 17, 1998. The entire specification and drawings of this earlier related copending application is hereby expressly incorporated by reference.

FIELD OF THE INVENTION

The field of the invention is the measurement of electrical current and/or apparent or real power in wires, cables or other conductors without any contact with the wires, cables, or other conductors. By combining the current measurement system with a voltage level sensor provides a method for determining voltage, current, and power in a circuit.

The system is designed to be used for rapid determinations of currents, voltages, and power by electrical and electronic workers.

BACKGROUND OF THE INVENTION

Present methods of non-contact current measurements in conductors often consists of the use of iron or other ferrous types of magnetic materials configured so as to surround a current carrying conductor in a transformer-like configuration. These present methods are often accurate and are widely employed in measuring a.c. currents in wires and other electrical conductors. The generic term for the instruments now widely employed is "current clamp", or "clamp-on current probe". These provide a means of rapidly measuring the a.c. current by surrounding the conductor with a closed or nearly closed magnetic circuit which is configured as a transformer which is designed for a convenient ratio for measurement to provide, for example, one milliampere per ampere, or one millivolt per ampere. The output of these clamp-on current probes is then read out on a meter or attached via wires to a multimeter. Manufacturers and distributors of such clamp-on current probes are, for example, Fluke Corporation, Amprobe Instruments, AEMC Instruments, Fieldpiece Corporation, Hewlett-Packard Corporation, and many others. A second common non-contact method of measuring current utilizes the Hall effect. A Hall element placed in the region of a magnetic field provides an output voltage proportional to the field. Hall element devices are often utilized for both a.c. and d.c. non-contact current measurements in wires and other conductors and are also widely available from these same manufacturers and distributors of a.c. clamp-on current probes.

The use of a closed magnetic circuit non-contact current probe provides the advantage that good accuracy is often obtained. The major disadvantages are that these clamps require complete or very nearly complete access to the wire or conductor so that the current clamp must completely surround the wire or conductor, that the characteristics of the ferromagnetic material are non-linear, the process of taking a reading is slow, and the current clamps are large, awkward and sometimes impossible to use when wires are in confined spaces.

In practice, for many cases, the electrical worker or electronic engineer cannot easily surround a conductor with a conventional current clamp because the conductor or wire may be fastened to a printed circuit board or very close to a wall or ceiling and it would be awkward and very inconvenient, and in some cases, impossible to use a current clamp. Also, in some cases, the non-linearity can be a serious problem when large as well as very small currents are to be measured because the hysteresis curve of the ferromagnetic materials used in these probes is, in general, non-linear, and will cause reading errors.

In addition to the use of non-contact current instruments, non-contact voltage sensing instruments are also now often employed by many electrical workers. These instruments provide a rapid indication of the existence of a voltage on an insulated wire by simply bringing the tip of the instrument close to or touching an insulated or bare wire carrying voltage. Thousands of such instruments are utilized in the electrical industry to determine whether or not there is a voltage on the wire or conductor. Usually these instruments light a light emitting diode, (LED), and/or sound a buzzer.

The relative voltage is difficult or impossible to determine with these instruments because they are simply triggered by the local electrical field which surrounds the wire or the conductor.

Basically, these instruments are in common use because they are inexpensive, pocket-sized, and provide a very quick decision of when a wire, conductor, or terminal is "hot", (has voltage), and is not.

Many of these voltage sensors are very simple in design. Typically, they utilize a digital IC gate which is triggered by the local electric field about a terminal or a wire. The IC then lights an LED to indicate the presence of an a.c. voltage. Because of their simplicity, low cost, and pocket size, these devices are widely employed in electrical industries.

The present invention provides means to overcome the disadvantages of the conventional current clamp and provides a quick indication of the current flow or of the power by simply touching the insulated or bare conductor, cable, or wire with the probe as described below. By combining the current probe described here with a voltage level sensor, the electrical worker will be provided with a much more versatile pocket sized instrument, and can measure power also. In many cases, the voltage is constant, and the apparent power is easily determined by scaling the output voltage to read out the power output directly.

SUMMARY OF THE INVENTION

The present invention utilizes the magnetic fields and the electrical fields surrounding a current carrying conductor. By providing coupling to that magnetic field, utilizing an open loop of a ferromagnetic material, the current can be measured. The probe design can take a number of different forms. In one form, the insulated probe is placed close to, or touched to an insulated or a bare wire, cable, or other conductor, and the induced voltage or current in the probe is used to provide an output reading which is proportional to the current in the wire, cable, or conductor. The output reading is then scaled to read out the actual current in the wire, cable or other conductor.

Alternatively, the scale may be set to read out the apparent or real power. In another form, the spacing of the probe is set exactly for known distances and the voltage or current induced in the probe is then exactly proportional to the current in the insulated wire or conductor, and a properly scaled voltage readout will provide the exact current in the wire or conductor. Such a probe, secured to a wire, cable, or other conductor can provide a monitoring system for the current or the power.

For d.c. measurements, the probe should be moved towards or away from the current carrying conductor, or rotated next to the conductor, and the output voltage can then be read out. The output voltage is proportional to the current.

In some cases, nearby current carrying wires or conductors cause the output reading of a wire under measurement to be increased or decreased from the true value. By employing an open loop of a ferromagnetic or mu metal material which passes through the coil, measurements may be carried out with some degree of accuracy due to the fact that the open ferromagnetic loop encounters a lower magnetic field then the commonly used closed loop, and is therefore much less likely to become magnetically saturated. This procedure of shielding neighboring wires from a desired measurement in one selected wire allows the measurement of current in a selected wire when there is a wire bundle. The open loop of ferromagnetic or mu metal loop provides several advantages for current measurements. These are, 1. The thin metal probe of the loop can be placed next to wires or conductors where the access space is very limited, 2. The loop tends to help select the current from one wire or conductor and reduces the interfering effects of current caring neighboring wires.

Further, additional shielding of the fields of other wires which may affect the measurement in the desired wire or cable, may be accomplished by utilizing a thin flexible ferromagnetic strip wrapped about those neighboring wires or conductors which affect the desired measurement.

These current probes are pocket sized and are a quick measure of the approximate current. There is a need for these convenient features. Furthermore, the current probes can be combined with a voltage level sensor and thereby provide electrical and electronic workers with a means of sensing voltage, and measuring the current and the power rapidly.

The current sensor is combined with a voltage level sensor. The voltage is sensed by means of capacitive coupling to the same insulated wire or conductor and a scaled output is used to drive a standard integrated circuit driver for an LED bar graph or another type of meter to display the level of voltage. The ability to easily switch between voltage and current indication provides the user with a very powerful method of determining the characteristics of the circuit under test.

Figure 1A:
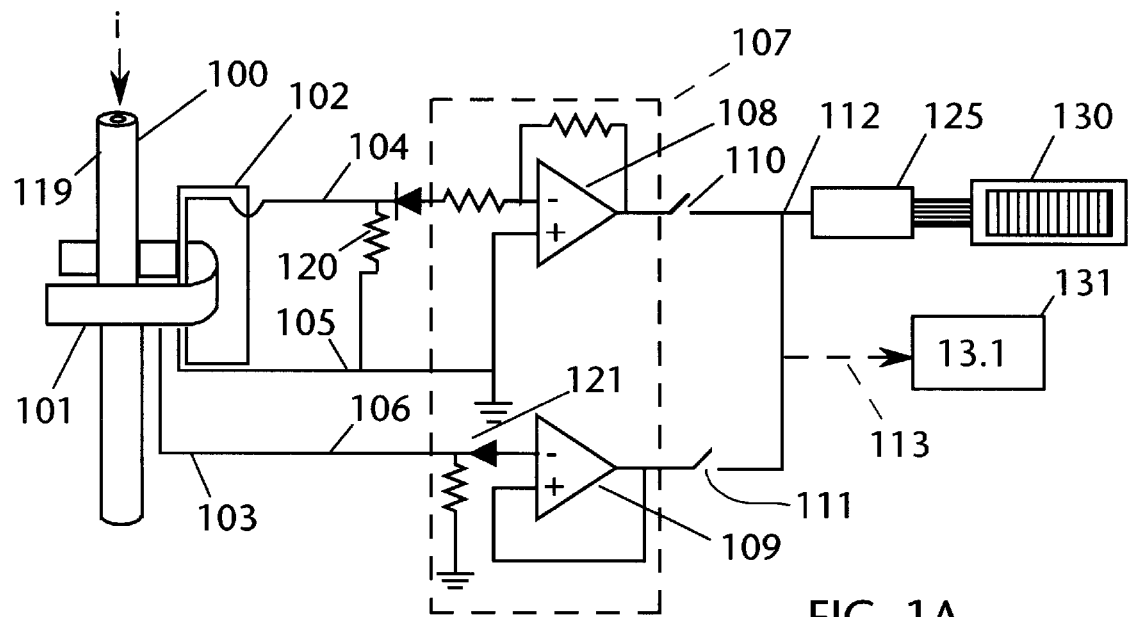
FIG. 1A is a drawing of one embodiment of the invention where the a.c. current flowing in an insulated wire or conductor induces a voltage in the probe coil which incorporates a "U" or a "J" shaped ferromagnetic material to help shield the pickup sensor from neighboring current sources. The output is then scaled or amplified to provide an output to an LED bar graph or another type of meter to display the level of current.
Figure 1B:
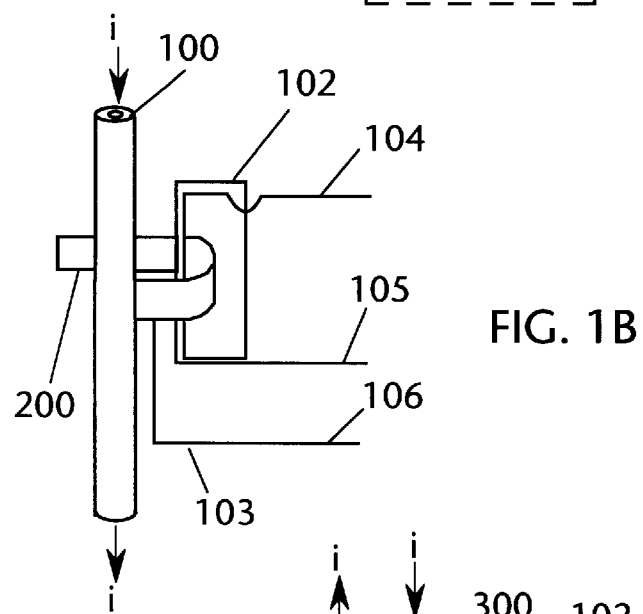

FIG. 1B Shows an alternative form of the sensor portion of the invention which illustrates the thin open loop of mu metal or other ferromagnetic material in a form of a "J". The advantage of the J shape is that the wire or conductor under measurement is more easily accessed with the thinner probe. The terminals 104, 105, and 106 are connected as shown in FIG. 1A.

Figure 1C:
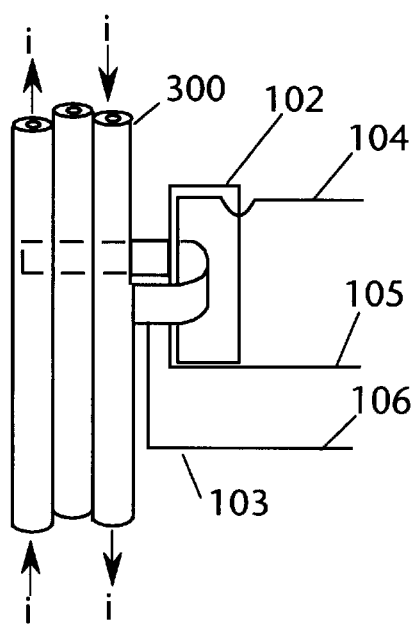

FIG. 1C shows the use of the sensor to measure current and voltage for cables such as Romex or other bundled wire cables. The terminals 104, 105, and 106 are connected as shown in FIG. 1A.

Figure 2A:
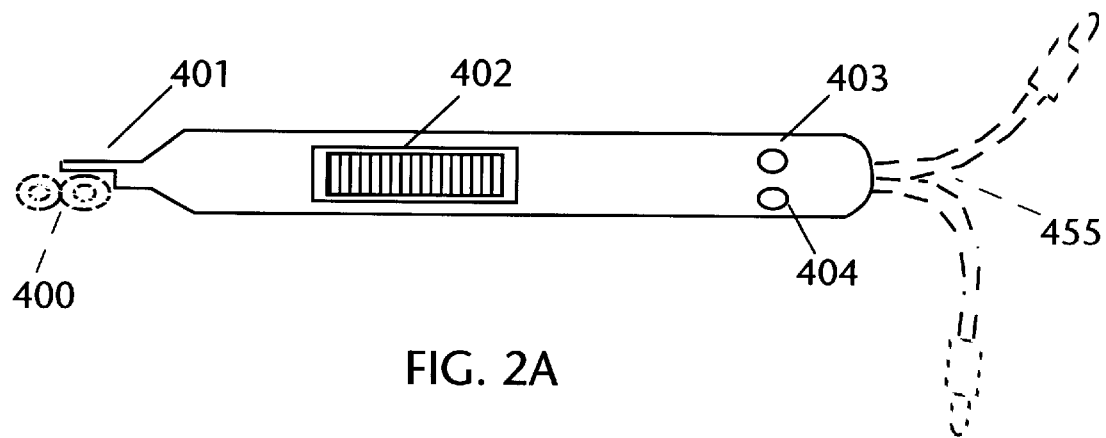

FIG. 2A illustrates the form of the invention using a narrow "L" shaped probe to measure the voltage and current in an insulated wire or a conductor.

Figure 2B:
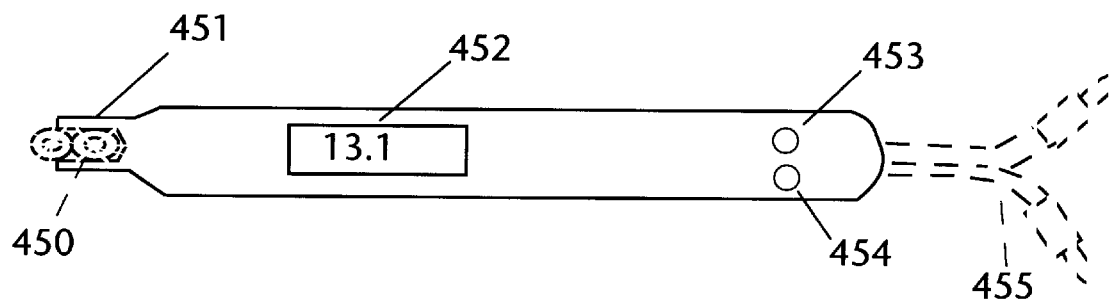

FIG. 2B illustrates another form of the invention using a "U" shaped probe.

Figure 3:
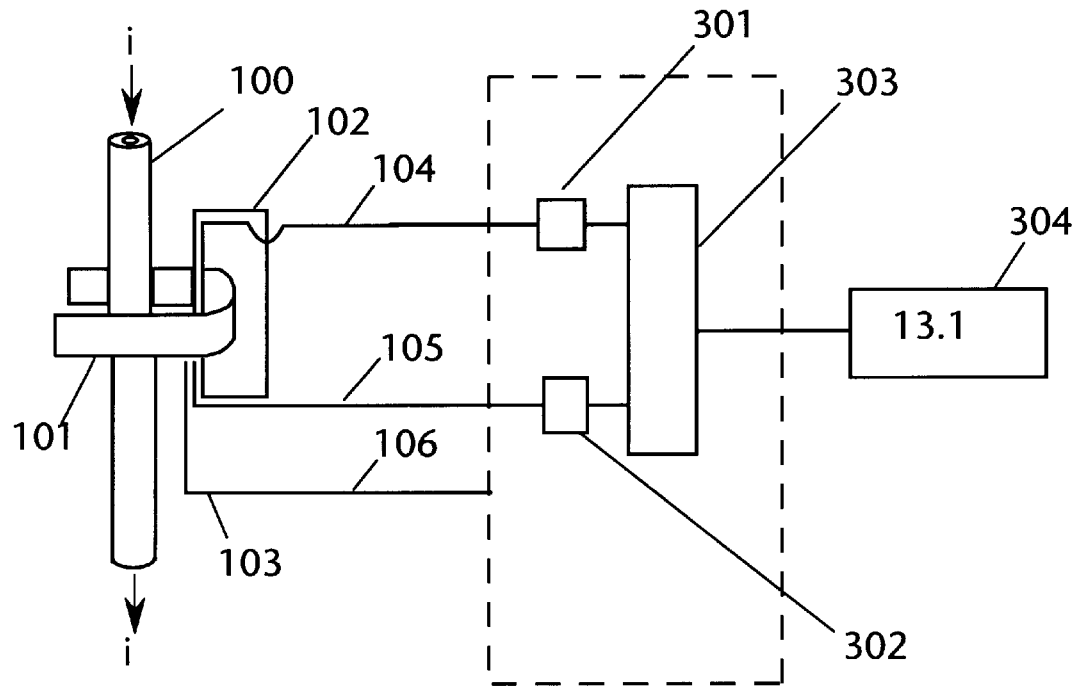

FIG. 3 illustrates the use of a digital processor as an alternative procedure to the use of an analog signal processor.

Figure 4:
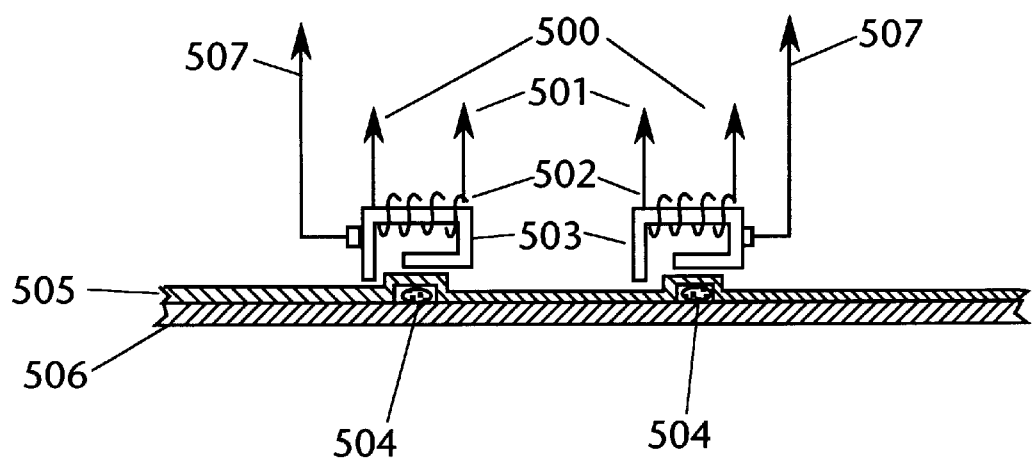

FIG. 4 illustrates the use of one, (or many), of the current-voltage sensors for measurement in very small conductors such as Integrated Circuit conductors or printed circuit conductors.

DETAILED DESCRIPTION OF PREFERRED EXEMPLARY EMBODIMENTS

Referring to FIG. 1A, the a.c. current flow and voltage in the wire or conductor 100 which may have insulation 119 is to be measured. The multi-turn pickup coil 102 which has a ferromagnetic strip configured as a half loop 101 is placed close to the insulated wire 100. Due to the magnetic field surrounding the wire, an a.c. voltage is induced in the coil 102. The voltage in coil 102 is then scaled by means of a potentiometer 120 and amplified by an op-amp 108, (or two or more cascaded op-amps, if more gain is required). The output is turned on by a push-button switch 110.

The potentiometer or variable resistor 120 may be used to scale or adjust the voltage so as to provide an output voltage 112 which is proportional to the current i. By connecting the output to a LED driver or a set of comparators 125 the output may be displayed on an LED bar graph 130. Alternatively, the output may be displayed on an LCD or LED digital display 131 through the output 113. For example, the value 13.1 is illustrated.

The same loop 101 is, at the same time, capacitively coupled to the wire. The capacitive coupling produces a small voltage on the wire 103. This voltage can be scaled using a potentiometer 121 and amplified with one or more op-amps 109. Then by selecting and pushing the push button 111 the scaled output is directed to the LED driver 125 which causes the LED bar graph 130 to display the value of the voltage. Alternatively the same output 113 may be displayed with an LCD or LED readout 131. Or the output may be carried by a cable or wires to an oscilloscope for the readout.

By combining the voltage and current sensors and sharing the same readout indicator, the voltage and current may be quickly determined for the purposes of trouble shooting or maintenance. Thereby the invention provides a convenient pocket-sized system for the electrical or electronic worker. The dotted lines 107 which border the operational amplifiers with adjustable gain, may alternatively represent a digital system such as is shown in FIG. 3.

Due to the linearity of the equations governing the voltage in the coil, when the system is calibrated for a single fiducial current in the wire or cable, it will remain in calibration for all current values in that wire or cable. The entire probe system can be encompassed in a pocket sized unit nearly the size of a fountain pen. The use of such a non-contact easily portable instrument is very helpful in the electrical industry as well as the aircraft, boating, air conditioning, refrigeration, and heating industries. The ability to quickly determine that wires have voltage and measurable current flow provides considerable aid to the maintenance workers and trouble shooters.

FIG. 1B shows an alternative pickup system for the current measurement. The wire 100 is now magnetically coupled to the ferromagnetic loop 200 which is "J" shaped. The J shape is very useful because access to the wire or conductor is easier. At the same time, the capacitive voltage measurement coupling to the loop 200 provides essentially the same voltage pickup for the measurement through the wire 103 as before. The terminals 104, 105, and 106 are connected to the signal processing system just as in FIG. 1A.

FIG. 1C shows the same J shaped pickup system as in FIG. 1B being used with a cable 300. The voltage induced into the coil 102 may be reduced or augmented by the other wires in the cable. However, scaling may be used to correct those effects, so that the potentiometer may be used to adjust the scale and the readout can provide the true current. Likewise, the voltages in the different wires of the cable may reduce or augment the voltage appearing on the wire 103. Here again, scaling may be used to adjust the values and the readout can provide the true voltage. For some round cables, the probe may be rotated around the cable to select the maximum current and maximum voltage readout. This is particularly easy to do if the output reading is taken using a multi-meter or an oscilloscope via output leads as shown in FIGS. 2A and 2B. The terminals 104, 105, and 106 are connected to the signal processing system just as in FIG. 1A.

FIG. 2A shows the form of the system designed to measure currents and voltages in insulated wires, in insulated cables, or in other conductors. The tip of the instrument 401 which encompasses the J shaped current/voltage sensor is lightly pressed against the wire or the cable 400. The push-button 404 is pressed and the voltage reading appears on the LED bar graph 402. For the current, the push-button 403 is pressed and the same LED bar graph will indicate the current, (on a differently labeled scale next to the bar graph).

FIG. 2B shows the instrument in another embodiment. Here the U shaped voltage/current sensor is lightly pressed against the wire or cable 450. The readout is shown as an LCD or LED readout 452. The voltage and current push-buttons are 454 and 453 respectively. 455 is an alternative readout system where two leads are brought out to banana plugs for the purpose of plugging into a conventional multimeter, or into an oscilloscope which may be used as the readout system once the output is scaled with a potentiometer. An oscilloscope readout provides the advantage that the display of the waveform provides more information.

FIG. 3 Shows the system of FIG. 1 with one modification. The analog signal processor of FIG. 1 within the dotted lines has been replaced by a digital signal processing system. Within the dotted lines, the Analog-to-Digital converters, (A/D) 301 and 302 provide digital signals to the central processing unit which may be a DSP, (Digital Signal Processor) 303. The central processor or DSP 303 then is programmed to drive a readout device such as a LCD or LED readout 304.

This invention can be implemented in pocket sized non-contact current/voltage reading systems designed for electrical workers usually working with 50/60 or 400 Hertz frequencies, where the voltages are generally 120, 240, or 480 volts and the currents are generally anywhere from a fraction of an ampere to a few thousand amperes. Recently we have built several models and have field tested them. They have proven to be a substantial aid to quickly determine the current flows in various electrical wiring configurations. In addition, these probes are scaleable so that by means of setting the gain, they may be used to directly read out the power in all of the cases where the voltage is constant and/or is known and/or measured.

An alternative type of output reading which has the virtue of low cost is the use of a flashing LED which is driven by a voltage to frequency integrated circuit which is a standard IC, such as, for example, the TelCom 9400 or 9401 or 9402.

The voltage to frequency converter provides pulse outputs to an LED which flashes at a rate proportional to the current or the voltage in the wire. For example, for one ampere, the flashing may be set at one flash per second, for two amperes, the flashing may be set at two flashes per second, etc., to ten flashes per second for indicating a current of ten amperes.

The flashing system can readily be engineered for a pause between the sets of flashes to simplify the readout interpretation.

These voltage-current probes may be modified to operate at higher frequencies and thereby be employed as Integrated Circuit probes or as printed circuit board probes. The signal frequencies of conductors in IC's and in many of the printed circuit boards are generally very high, in the megahertz region or greater. The magnetic sensor, as shown in FIG. 4, has a response of output voltage v, $$v = K L \, di/dt \qquad (1)$$

where, K is the coupling factor to the conductor, L is the inductance of the pickup coil, and di/dt is determined by the frequency of the current flow in the conductor. For example for a sine wave of angular frequency w, di/dt becomes, $$di/dt = w \cos wt \qquad (2)$$

Therefore, the detected voltage in the current sensor is directly proportional to the angular frequency w.

At high frequencies, this enables a sensor to be made that is very small because the sensitivity will be high whenever the current is at a high frequency.

FIG. 4 illustrates the use of two of the sensors in very small conductors such as is found in Integrated Circuits and in printed circuit boards. The reason for showing two sensors is that it illustrates the concept of having an array of sensors to test electronic systems under operating conditions. The underlying insulating substrate surface 506 of these is shown greatly magnified in cross-section. The conductors 504 may be carrying a.c. currents at high frequencies for test purposes. Frequently there is an insulating coating 505 over the conductors.

The magnetic sensors consist of the thin mu metal forms 503 with coils 502 wound about them. The output leads of the coils 500 and 501 are to be connected to amplifiers and signal processors so as to display or record the scaled currents in the conductors 504. Generally, a digital computer can be used to keep the data from multiple conductors in an appropriate array for analysis and display. At the same time, the ferromagnetic strips 503 may be utilized as voltage sensors because of their capacitive coupling to the conductors 504. The wire leads 507 are directed to amplifiers and signal conditioners and then, if desired, to a digital computer for display of an array of scaled values. This procedure provides a means of testing IC's or Printed Circuit Boards in an active mode with signals along the conductors.

The foregoing description of the preferred embodiment of the invention has been presented for purposes of illustration and description. It is not intended to be exhaustive or to limit the invention to the precise form disclosed, and many modifications and variations are possible in light of the above teaching without deviating from the spirit and scope of the invention. The embodiment described is selected to best explain the principles of the invention and its practical application to thereby enable others skilled in the art to best utilize the invention in various embodiments and with various modifications as suited to the particular purpose contemplated. It is intended that the scope of the invention be defined by the claims appended hereto.

What is claimed is:

1. A device for non-contact measurement of AC current flow in a conductor, including:

a coil having a plurality of turns of wire;

at least one sensing strip extending from said coil, said sensing strip formed of ferromagnetic material;

said sensing strip having a proximal end extending through said coil and a distal end adapted to be brought into close proximity to the conductor, whereby said sensing strip may direct a portion of the electromagnetic field of the AC current flow in the conductor to said coil, and a first voltage is induced in said coil;

means for displaying said first voltage; and, means for scaling the output of said means for displaying so that the first voltage display is representative of the current flow in the conductor.

2. The device for non-contact measurement of claim 1, further including voltage sensing means for remotely sensing a second voltage, said second voltage comprising the voltage on the conductor.

3. The device for non-contact measurement of claim 2, wherein said voltage sensing means includes means for capacitively coupling said at least one sensing strip to the conductor, and a voltage sensing lead connected to said at least one strip to detect said second voltage.

4. The device for non-contact measurement of claim 3, further including display selector switch means for selectively connecting said first or second voltages to said means for displaying, whereby either said first or second voltages may be displayed to indicate current in the conductor or voltage on the conductor, respectively.

5. The device for non-contact measurement of claim 1, wherein said at least one sensing strip is provided with a "J" configuration, said J configuration having a hook end comprising said proximal end.

6. The device for non-contact measurement of claim 1, wherein said at least one sensing strip is provided with a "U" configuration, said U configuration having a closed end comprising said proximal end.

7. The device for non-contact measurement of claim 1, wherein said means for displaying includes a display having a plurality of digits.

8. The device for non-contact measurement of claim 4, wherein said means for displaying includes a display having a plurality of digits.

9. The device for non-contact measurement of claim 1, wherein said means for displaying includes a plurality of light emitting devices, and further including means for illuminating a variable number of said plurality of light emitting devices, said variable number being proportional to said first voltage.

10. The device for non-contact measurement of claim 4, wherein said means for displaying includes a plurality of light emitting dens, and further including means for illuminating a variable number of said plurality of light emitting devices, said variable number being proportional to said first voltage or said second voltage.

11. The device for non-contact measurement of claim 1, wherein said means for displaying includes a voltage-to-frequency converter connected to receive said first voltage and produce an output signal having a frequency proportional to said first voltage, and a light emitting device connected to receive said output signal and to flash at a rate proportional to said first voltage.

12. The device for non-contact measurement of claim 4, wherein said means for displaying includes a voltage-to-frequency converter connected to receive said first or second voltage from said display selector switch means and produce an output signal having a frequency proportional to said first or second voltage, and a light emitting device connected to receive said output signal and to flash at a rate proportional to said first or second voltage.

13. The device for non-contact measurement of claim 1, further including means for amplifying said first voltage and conducting the amplified voltage to said means for displaying.

14. The device for non-contact measurement of claim 1, wherein said means for scaling the output includes an adjustable gain control for said means for amplifying said first voltage.

15. The device for non-contact measurement of claim 1, wherein said means for scaling the output includes an adjustable potentiometer connected across said first voltage to provide a selectively attenuated first voltage output to said means for displaying.

16. The device for non-contact measurement of claim 1, further including a generally pen-like housing having said coil mounted at one end of said housing, and said at least one sensing strip having said distal end extending from said one end of said housing.

17. The device for non-contact measurement of claim 16, wherein said means for displaying includes a digital display secured displayed exteriorly of said housing.

18. The device for non-contact measurement of claim 16, wherein said means for displaying includes a bar graph displayed exteriorly of said housing.

19. A method for non-contact measurement of AC current and voltage in a conductor, including the steps of:

providing a sensing coil having a plurality of turns of wire;

providing a sensing strip having a proximal end extended through the coil, and having a distal projecting end;

placing said distal projecting end of said sensing strip in close proximity to the conductor, whereby the sensing strip may direct a portion of the electromagnetic field of the AC current flow in the conductor to said coil, and a first voltage is induced in said coil;

displaying said first voltage; and, scaling said display of said first voltage so that the first voltage display is a representation of the current flowing in the conductor.

20. The method of claim 19, further including the step of detecting the voltage on the conductor, including capacitively coupling a voltage sensor to the conductor, said voltage sensor generating a second voltage proportional to the voltage on the conductor, and displaying either said first or second voltages.

21. The method of claim 20, further including using said sensing strip as the voltage sensor that is capacitively coupled to the conductor.

22. A device for non-contact measurement of AC current flow and voltage in a conductor, including:

a coil having a plurality of turns of wire;

means for placing said coil in close proximity to the conductor whereby a portion of the electromagnetic field of the AC current flow in the conductor impinges on said coil, and a first voltage is induced in said coil;

display means for displaying said first voltage; and, means for scaling the output of said display means so that the first voltage display is representative of the current flow in the conductor;

voltage sensing means for remotely sensing a second voltage, said second voltage comprising the voltage on the conductor;

said display means also selectively displaying said second voltage.

* * * * *